US009410665B2

(12) United States Patent
Lind et al.

(10) Patent No.: US 9,410,665 B2
(45) Date of Patent: Aug. 9, 2016

(54) FLEXIBLE RIBBON LED MODULE

(71) Applicant: The Sloan Company, Inc., Ventura, CA (US)

(72) Inventors: Justin Lind, Camarillo, CA (US); Timothy Drew Ferrie, Ojai, CA (US); Bruce Quaal, Ventura, CA (US)

(73) Assignee: THE SLOAN COMPANY, INC., Ventura, CA (US)

( * ) Notice: Subject to any disclaimer, the term of this patent is extended or adjusted under 35 U.S.C. 154(b) by 148 days.

(21) Appl. No.: 14/192,733

(22) Filed: Feb. 27, 2014

(65) Prior Publication Data

US 2014/0247595 A1  Sep. 4, 2014

Related U.S. Application Data

(63) Continuation-in-part of application No. 13/942,436, filed on Jul. 15, 2013.

(60) Provisional application No. 61/672,211, filed on Jul. 16, 2012.

(51) Int. Cl.
*G09F 13/06* (2006.01)
*F21S 4/00* (2016.01)
*F21K 99/00* (2016.01)
*G09F 13/04* (2006.01)
*H05K 1/02* (2006.01)

(52) U.S. Cl.
CPC ... *F21K 9/30* (2013.01); *F21S 4/20* (2016.01); *F21S 4/22* (2016.01); *G09F 13/0404* (2013.01); *H05K 1/028* (2013.01); *H05K 2201/0909* (2013.01); *H05K 2201/10106* (2013.01)

(58) Field of Classification Search
CPC ............ H05K 2201/0909; H05K 2201/10106; H05K 1/0278; H05K 1/028; F21K 9/30; F21S 4/003; F21S 4/005; F21S 4/006; F21S 4/007; F21S 4/008; F21S 4/10; F21S 4/20; F21S 4/22; F21S 4/24; F21S 4/26; G09F 13/0404; F21V 17/02
See application file for complete search history.

(56) References Cited

U.S. PATENT DOCUMENTS

| 4,439,818 | A |  | 3/1984 | Scheib |
| 5,697,175 | A |  | 12/1997 | Schwartz |
| 5,742,484 | A | * | 4/1998 | Gillette ............... H05K 1/148 174/106 R |
| 6,042,248 | A |  | 3/2000 | Hannah |
| 6,592,238 | B2 | * | 7/2003 | Cleaver ............... F21S 4/007 362/219 |

(Continued)

FOREIGN PATENT DOCUMENTS

| DE | 102008059552 | 6/2010 |
| WO | WO0177578 A2 | 10/2001 |
| WO | WO2004076913 | 9/2004 |

OTHER PUBLICATIONS

International Report and Written Opinion from Appl. No. PCT/US2013/050668, dated Jan. 29, 2015.

(Continued)

*Primary Examiner* — Alan Cariaso
(74) *Attorney, Agent, or Firm* — Koppel, Patrick, Heybl & Philpott

(57) ABSTRACT

The invention described herein is directed to different embodiments of a low profile lighting unit that in some embodiments is adapted to conform to the shape of the mounting surface and/or adapted to be adjustable so as to be arranged in different configurations to accommodate various lighting applications.

20 Claims, 7 Drawing Sheets

(56) References Cited

U.S. PATENT DOCUMENTS

| | | | |
|---|---|---|---|
| 6,932,495 B2 | 8/2005 | Sloan et al. | |
| 7,063,440 B2* | 6/2006 | Mohacsi | F21S 2/00 362/238 |
| 7,118,251 B1* | 10/2006 | Chambers | G09F 13/0404 362/311.02 |
| 7,241,031 B2 | 7/2007 | Sloan et al. | |
| 8,523,391 B2* | 9/2013 | Ishizuka | F21K 9/00 361/785 |
| 2003/0112627 A1 | 6/2003 | Deese | |
| 2010/0149811 A1* | 6/2010 | Sloan | G09F 13/0404 362/249.03 |
| 2012/0002417 A1 | 1/2012 | Li | |

OTHER PUBLICATIONS

International Search Report and Written Opinion from Patent Appl. No. PCT/US2013/050668 dated Oct. 10, 2013.

* cited by examiner

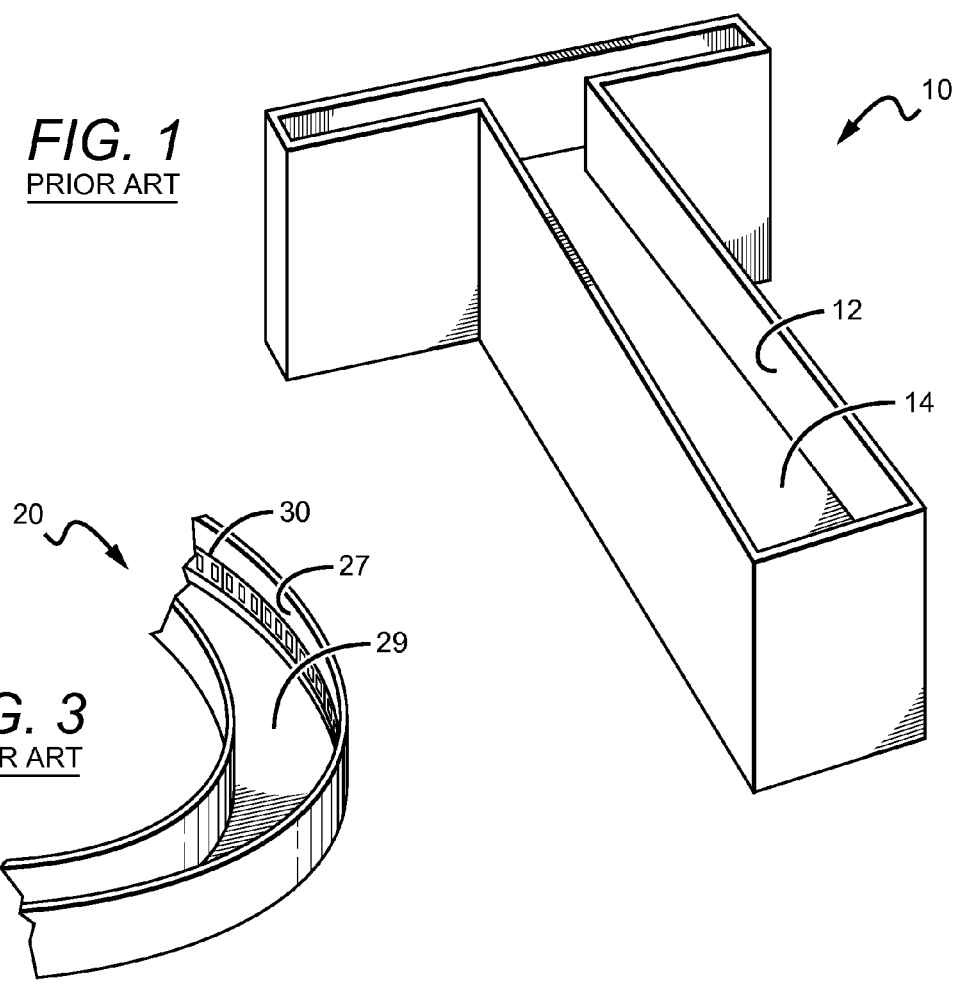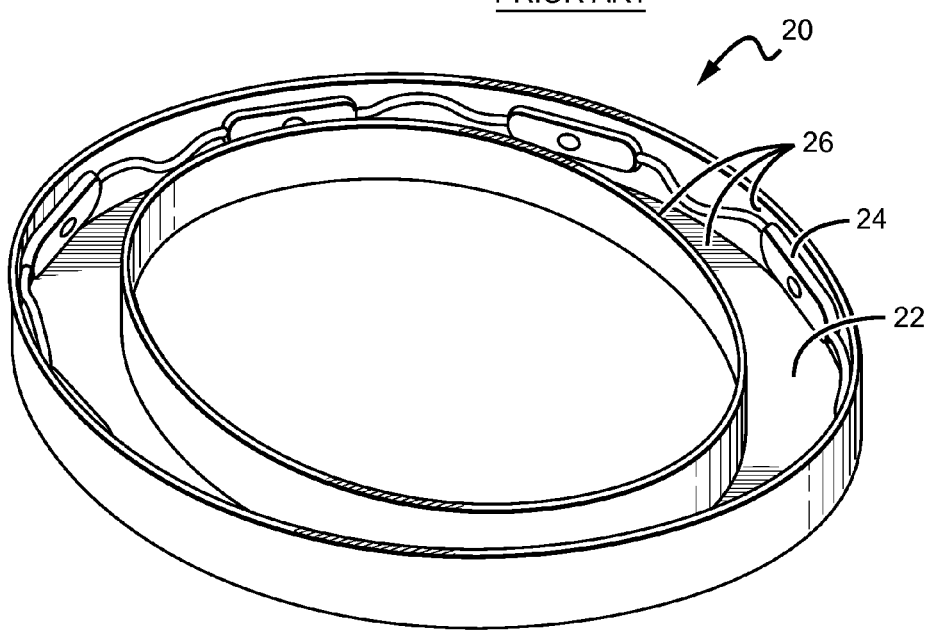

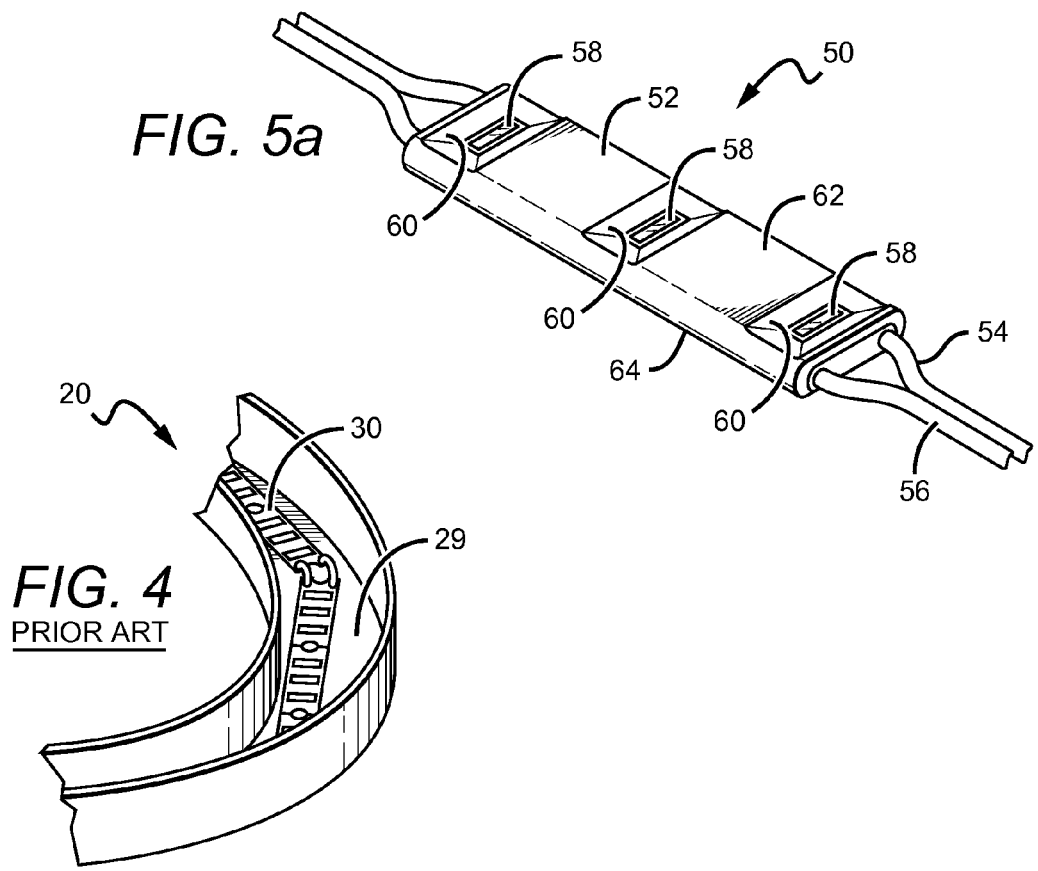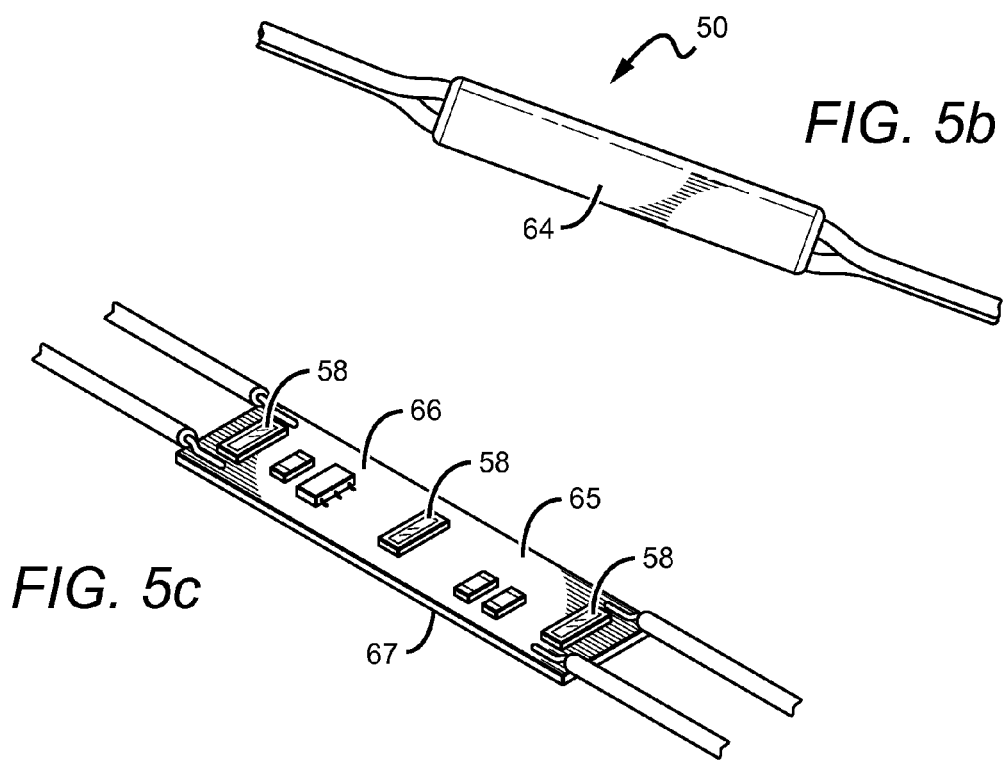

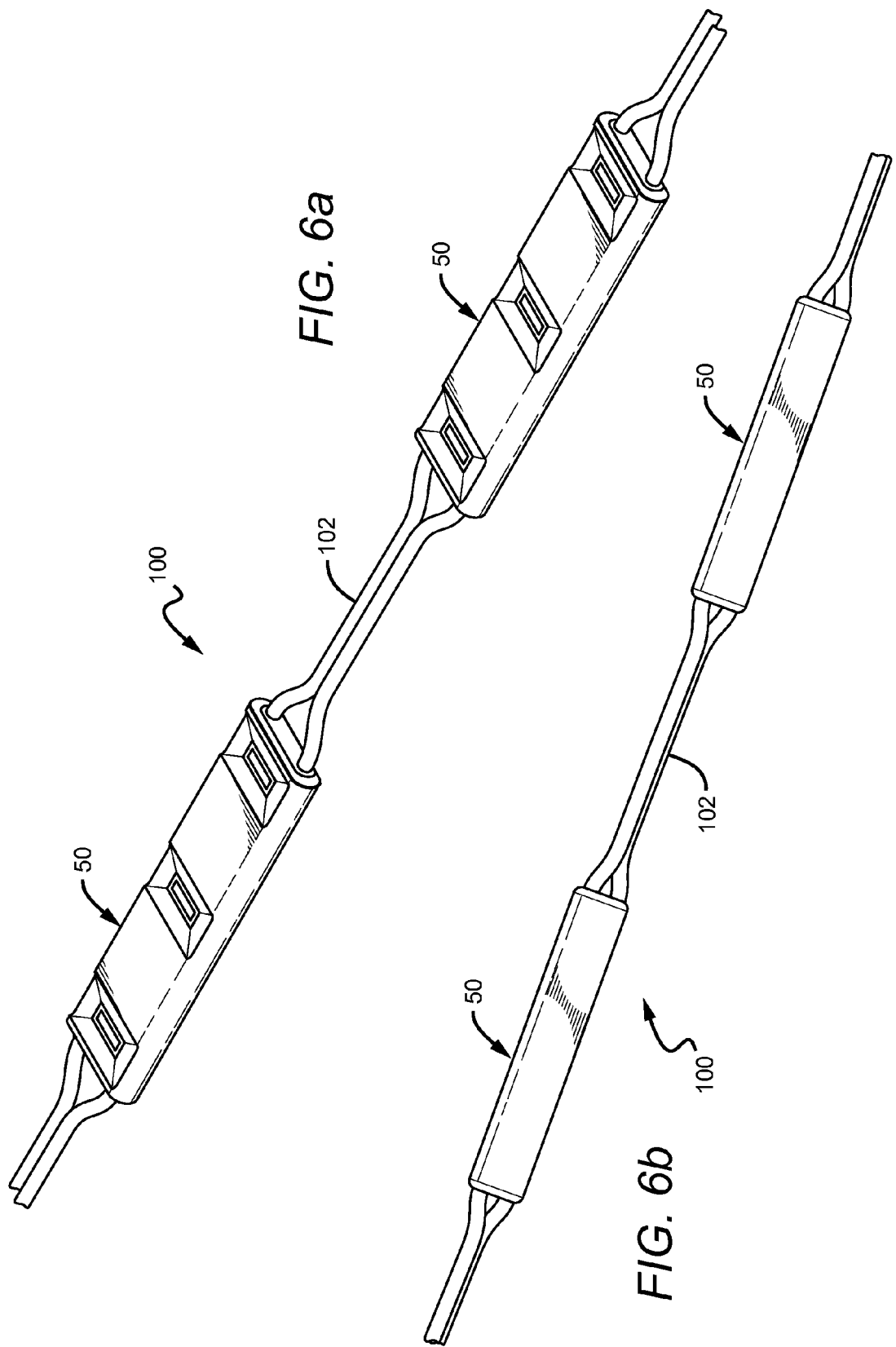

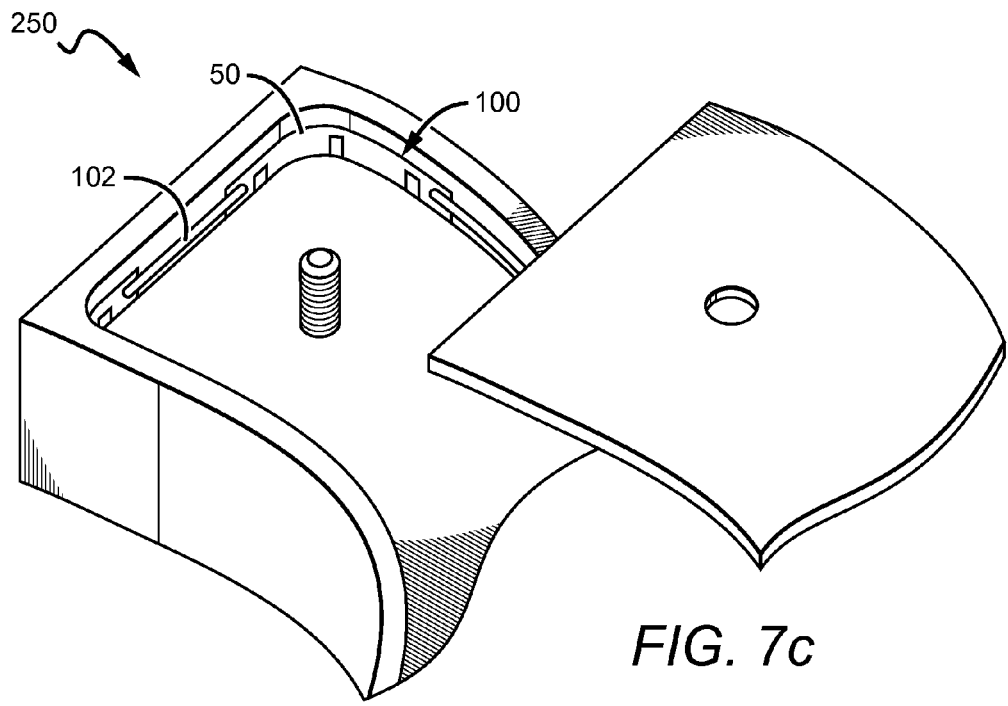
FIG. 7c
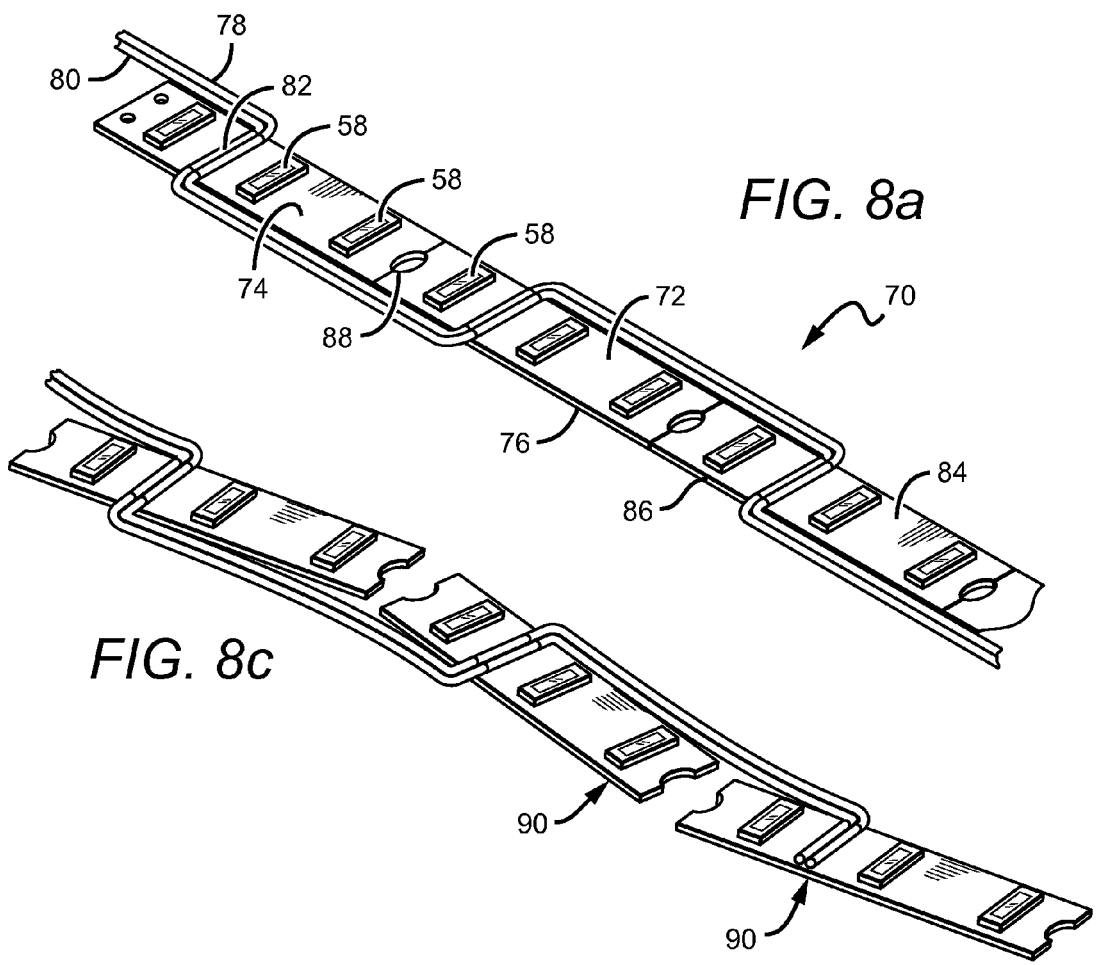
FIG. 8a
FIG. 8c

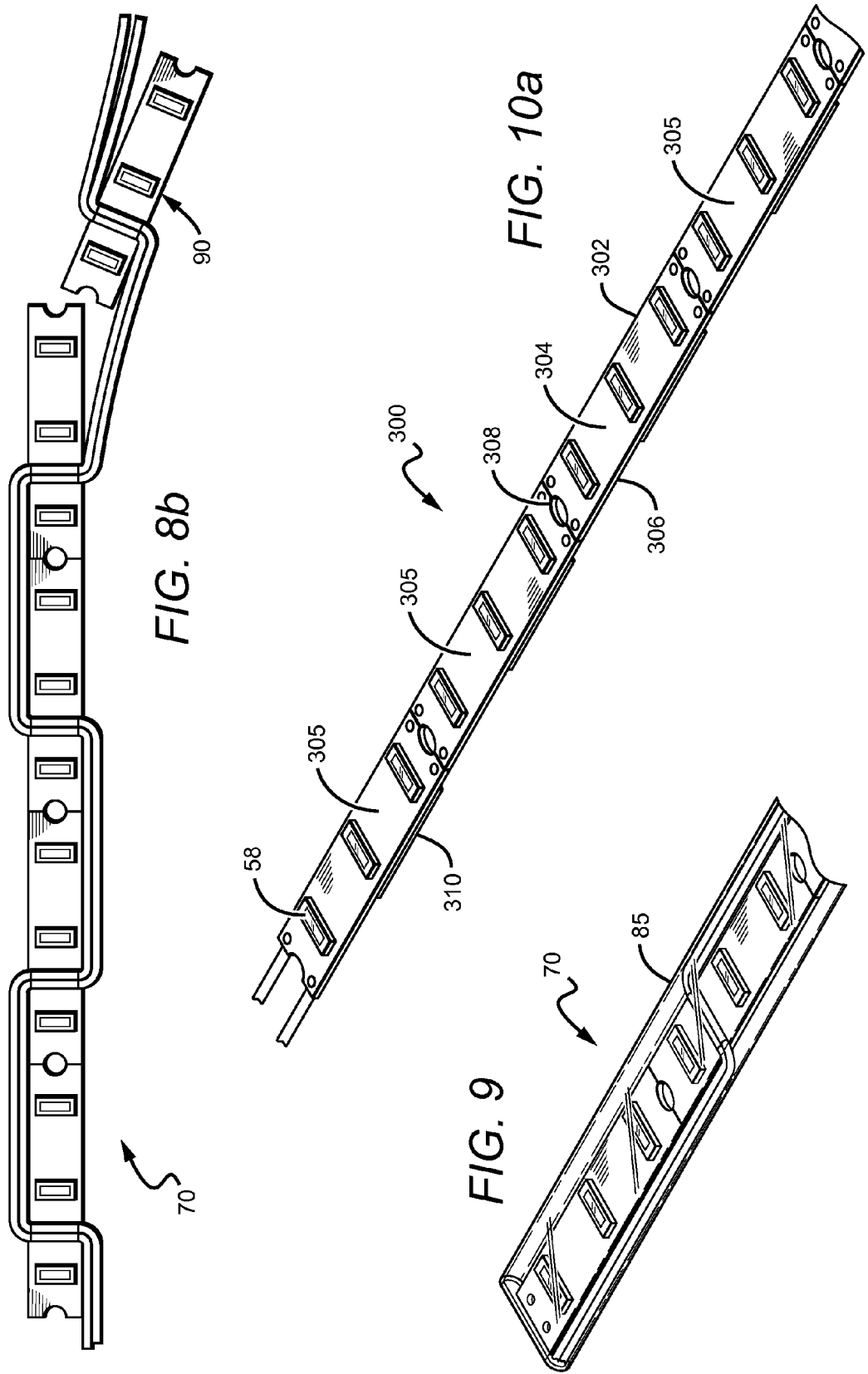

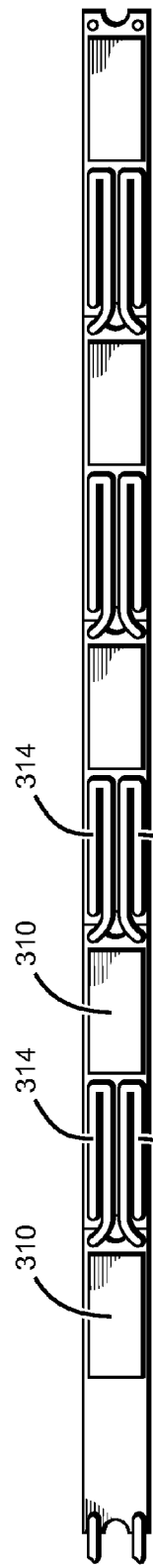
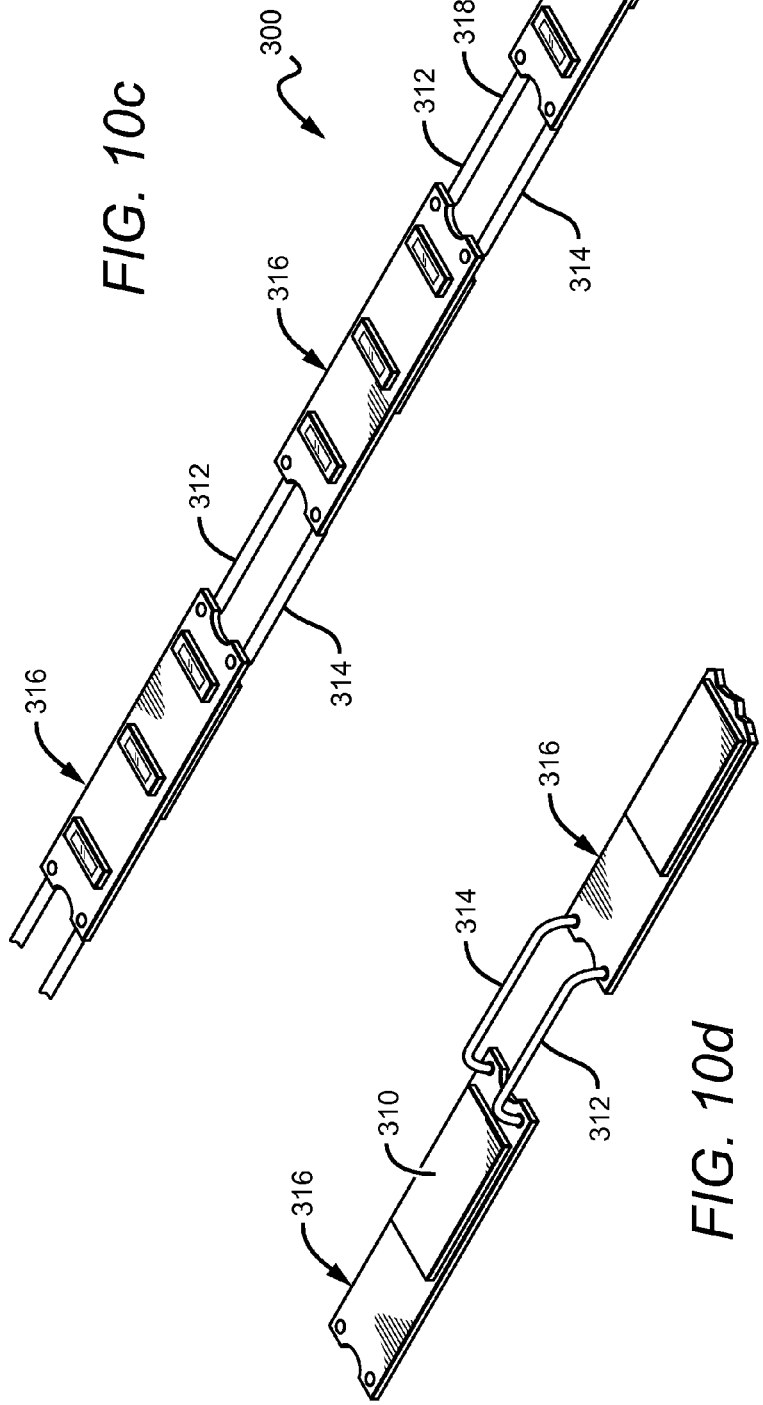
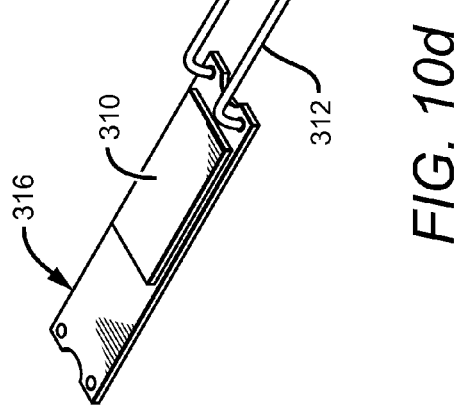

FLEXIBLE RIBBON LED MODULE

RELATED APPLICATION

This application is a continuation in part application of Ser. No. 13/942,436 to Lind et al., filed on Jul. 15, 2013, which claims the benefit of priority of U.S. Provisional Application Ser. No. 61/672,211 to Lind et al., which was filed on Jul. 16, 2012. The contents of Ser. Nos. 13/942,436 and 61/672,211, including the drawings, schematics, diagrams and written description, are hereby incorporated in their entirety by reference.

BACKGROUND OF THE INVENTION

1. Field of the Invention

This invention relates to lighting units, which are well suited for use with solid state Lighting sources, such as light emitting diodes (LEDs), and more particularly to LED based low profile lighting units for different illumination applications such as illuminating channel letters.

2. Description of the Related Art

Recent developments in LEDs have resulted in devices that are brighter, more efficient and more reliable. LEDs are rugged, consume less power, have a relatively long life (up to 100,000 hours), operate at low voltage, and are 30 to 70% more energy efficient than conventional lights, such as incandescent, neon or fluorescent bulbs. As a result of these developments, LEDs are becoming utilized in many more lighting applications that were previously the realm of incandescent, neon or fluorescent light sources.

Channel letters are commonly found on the outside of buildings and are often used to advertise the name of the business. They are typically constructed of aluminum or plastic housing having the shape of a letter and are approximately 5" deep, while low profile channel letter housings are less than 5" deep. The housing has a generally U-shaped cross-section, with the top opening in the housing covered by a colored translucent lens that transmits light from within the housing. Low profile channel letters are being used in different settings, such as indoors or where physical space is limited.

Channel letters are typically illuminated with neon or fluorescent light sources that are mounted within the channel letter housing. Neon and fluorescent lights provide a bright and continuous light source that allows the channel letters to be visible at night. These light sources, however, have a relatively short life (20,000 hours), are fragile, operate at high voltage (7,000 to 15,000 volts for neon) and can consume a relatively large amount of power. Neon bulbs can also experience difficulty with cold starting, which can lead to the bulb's failure. These light sources can be bulky such that they would not be able to be used in low profile channel letter housings. Additionally, neon and fluorescent lights have rigid housings that are shaped to fit the desired application. Neon and fluorescent lights do not have the flexibility of being able to be manipulated and/or adjusted to accommodate for different applications after the shape of the housing has been formed.

Conventional channel letter lighting units are typically made of a rigid PCB within a housing, while other conventional channel letter lighting units are arranged as a long, flexible ribbon. Conventional rigid modules work well in shallow channel letters as long as the overall face of the letter is quite large. Shallow channel letters that are either very small overall or have a narrow cavity that allow only a single row of modules to be installed can appear blotchy and uneven when illuminated with conventional channel letter rigid modules. This trend holds for nearly every type of channel letter including: face-lit, back-lit or halo, and solid-lens acrylic letters. Because they are rigid, these modules are not ideal to install on tightly curved walls of small channel letters.

Conventional flexible ribbon-style products solve many of the above problems, encountered by rigid modules, as they typically feature more lower-powered LEDs spaced closely together. The closely spaced LEDs solve the blotchy appearance of many applications. However, the flexible ribbon products are limited in two key ways. The first is that they only flex in one plane. This does not limit their use on the walls around the perimeter of channel letters. However, if the channel letter shape or application is more conducive to mounting the LEDs on either the face or bottom of the letter, the flexible ribbon must be cut and spliced into several short, straight sections. This is analogous to attempting to create a circular pattern of tape on a flat piece of paper; an impossible feat without cutting the tape into short sections. The need for an installer to cut and splice sections of ribbon product together makes apparent the second key limitation of flexible ribbon products. To connect the ribbon the installer must cut and strip two pieces of wire to solder between each connection. This process is quite tedious and requires soldering implements. The over molded versions of LED ribbon products require the additional step of scraping the overmold off to expose the solder connection point. Both types of ribbons leave the solder joint exposed unless the installer takes yet another additional step of coating or covering the joint.

For example, FIG. 1 shows a small, back-lit channel letter unit 10 with a very narrow cavity 12. The channel letter 10 only has enough room for 5-10 of the smallest conventional channel letter modules. Those modules do not spread emitted light sufficiently to provide an even light distribution. The ideal way to propagate the channel letter unit 10 with conventional channel letter products is with an LED ribbon device on the bottom flat surface 14. In order to ensure proper installation, the installer must cut and splice 2 or 3 sections together.

FIG. 2 shows another conventional shallow back lit channel letter unit 20 with a narrow cavity 22 propagated with small conventional channel letter modules 24. The configuration shown in FIG. 2 does not provide even light distribution, because the channel letter modules 24 are too far apart to blend evenly in such a shallow channel letter unit 20. The modules 24 occupy too much space to allow the light to properly reflect off the inner surfaces 26 of the channel letter 20. A better way to propagate the channel letter unit 20 is to use an LED ribbon product 30 mounted to either the wall 27 or bottom 29 of the channel letter unit 20, as shown in FIGS. 3 and 4. Mounting a ribbon product 30 to the wall 27 is relatively simple, as it only requires one continuous strip. FIG. 3 shows an example of the conventional LED ribbon product 30 mounted to the wall 27 of the channel letter unit 20.

FIG. 4 shows an example of the conventional LED ribbon product 30 mounted to the bottom 29 of the channel letter unit 20. A disadvantage of mounting the LED ribbon product 30 to the bottom 29 of the channel letter unit 20 is that the LED ribbon product 30 must be cut and spliced forming multiple sections of the ribbon product 30, in order to provide illumination to the channel letter unit 20. This increases the complexity of the installation as well as the time and expense of installing the LED ribbon product 30.

LEDs have certain characteristics that make them desirable for many lighting applications that were previously the realm of incandescent or fluorescent lights. Incandescent lights are very energy-inefficient light sources with a vast majority of the electricity they consume being released as heat rather than light. Fluorescent light bulbs are more energy efficient than incandescent light bulbs, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1,000 hours. Fluorescent bulbs can also have lifetimes longer than incandescent bulbs such as in the range of approximately 10,000-20,000 hours, but provide less desirable color reproduction. In comparison, LEDs can have lifetimes between 50,000 and 70,000 hours. The increased efficiency and extended lifetime of LEDs is attractive to many lighting suppliers and has resulted in LED lights being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

The increased efficiency and extended lifetime of LEDs is attractive to many lighting suppliers and has resulted in LED lights being used in place of conventional lighting in different sign applications. For example, U.S. Pat. No. 5,697,175 to Schwartz, discloses a low power illuminated sign that is particularly adapted for use with common EXIT signs over doorways. The back of each sign comprises a reflector with a series of cavities with curved surfaces. Each cavity corresponds to a letter and background area in the sign. LEDs are mounted in the center of the cavities to illuminate the letters or background area. The LEDs are provided on a separate perpendicular circuit board or on a central projection formed in the bottom of the cavities, with light from the LEDS directed outward. The letters and background area of the sign are illuminated by light reflecting forward from the curved surfaces of the cavities, so that the only visible light is from the illumination of the cavities.

U.S. Pat. No. 6,042,248, to Hannah et al., discloses an LED assembly for channel letter illuminating signs having an enclosure/housing covered by a translucent lens. Each sign includes a plurality of track moldings at the base of its enclosure, with the moldings running along the longitudinal axis of the sections of the channel letter. Linear arrays of LEDs are mounted on printed circuit boards (PCBs) that are then mounted in the track moldings. Each track molding can hold two PCBs in parallel with each of the PCBs arranged on a longitudinal edge, with the LEDs directed outward.

U.S. Pat. No. 4,439,818 to Scheib discloses a lighting strip that utilizes LEDs as the light source. The strip is flexible in three dimensions and is useful in forming characters and is capable of providing uniform illumination regardless of the characters selected for display. The strip comprises a flexible multi-layered pressure sensitive adhesive tape, having a plurality of triangle cutout sections on each side of the tape, with LEDs connected in a series with a resister. One disadvantage is that this arrangement is not durable enough to withstand the conditions for outdoor use. The flexible tape and its adhesive can easily deteriorate when continually exposed to the elements. Furthermore, this strip cannot be cut to different lengths for different, custom applications.

U.S. Pat. Nos. 6,932,495 and 7,241,031, both to Sloan et al., disclose channel letter lighting units and lighting systems utilizing the lighting units. In some embodiments these lighting units can be provided as multiple lighting units interconnected by conductors in a chain so that an electrical signal applied to the chain causes the lighting units to emit light. The chain can be made available to purchasers on different holding devices such as a box, reel or rack. Different lengths of the chain can be utilized for a particular channel letter, with the desired length of chain being cut from the holding device and mounted within the channel letter. Power can then be applied to the chain in the channel letter causing the units to emit light.

Different types of chains can have different numbers of lighting units per a length, or stated differently, a different density of lighting units. These chains are typically sold at a cost per measure of length, and the cost per length is typically greater for lighting systems having higher density. To accommodate the different needs of customers for chains of different densities, many different types of lighting system chains need to be maintained and stored and made available to customers. In some channel letter applications it may be desirable to have different densities of units in different locations. This can require purchasing multiple chains with different densities for the same job.

It is desirable to provide a lighting unit that is flexible, has a relatively low profile, and can be customized to fit and be mounted on a variety of different structures. As part of this ability to customize, it is desirable to provide a lighting unit that can be cut on location without compromising the function of the underlying light emitting devices.

SUMMARY

The invention provides various embodiments of lighting units that are efficient, reliable, cost effective and can be arranged to provide illumination for channel letters. The different embodiments comprise elements to provide a flexible low profile lighting unit that is able to be bent in various directions. The lighting units can comprise many different materials or devices arranged in different ways, with some devices comprising a reflector. The invention is also configured such that the lighting units can be easily installed by a single individual.

In one embodiment, as broadly described herein, a lighting unit comprises a flexible printed circuit board (PCB) comprising a top surface and a bottom surface, at least one light emitting element on said PCB, and a housing, wherein said housing covers part of said PCB and is configured to receive said at least one light emitting element. The lighting unit further comprises conductors to provide an electrical current to each of said at least one light emitting element. The light emitting elements are adapted to emit light in a direction away from said housing, in response to the electrical current supplied by the conductors.

In another embodiment, a lighting unit comprises an elongated flexible PCB, at least one light emitting element on a top surface of said PCB, and first and second conductors adapted to provide an electrical current to each of said at least one light emitting element. The lighting unit further comprises a housing that covers part of said lighting unit while allowing each of said at least one light emitting element to be uncovered. The lighting unit further comprises at least one perforation such that part of said PCB is configured to be separated from said PCB while maintaining the connection of said first and second conductors, wherein the separated portion of said PCB comprises at least one of said light emitting elements. The separated portion of said PCB is adapted to be positioned in different configurations to accommodate various lighting applications.

Some further embodiments provide channel letter lighting systems. These embodiments can comprise a channel letter housing having a translucent or transparent channel letter cover, a plurality of electrically connected lighting units mounted to the channel letter housing, and conductors to provide an electrical signal to each of the units. Each of these lighting units comprise a PCB having a plurality of light emitting elements adapted to emit light substantially away from said PCB. The PCB is adapted to conduct and dissipate heat from the light emitting elements. The lighting units are configured to accommodate for the shape of the channel letter housing, such that said lighting units can be bent and/or twisted in different directions. In some embodiments, the lighting units are further configured such that part of the lighting unit is separable forming an individualized lighting unit, wherein the separated individualized lighting unit can be repositioned, bent and/or twisted to accommodate for the shape of the channel letter housing.

These and other aspects and advantages of the invention will become apparent from the following detailed description and the accompanying drawings which illustrate by way of example the features of the invention.

BRIEF DESCRIPTION OF THE DRAWINGS

FIG. 1 is a perspective view of one embodiment of a prior art channel letter unit.

FIG. 2 is a perspective view of another embodiment of a prior art channel letter unit.

FIG. 3 is a perspective view of another embodiment of a prior art channel letter unit.

FIG. 4 is a perspective view of another embodiment of a prior art channel letter unit.

FIG. 5a is a perspective view of a lighting unit according to an embodiment of the invention.

FIG. 5b is a bottom view of the light unit of FIG. 5a.

FIG. 5c is a perspective view of a lighting unit according to an embodiment of the invention.

FIG. 6a is a perspective view of a light assembly according to an embodiment of the invention.

FIG. 6b is a bottom view of the light assembly of FIG. 6a.

FIG. 7c is a zoomed in perspective view of the channel letter lighting system of FIG. 7b.

FIG. 8a is a perspective view of a lighting unit according to an embodiment of the invention.

FIG. 8b is another perspective view of the lighting unit of FIG. 8a.

FIG. 8c is another perspective view of the lighting unit of FIG. 8a.

FIG. 9 is a perspective view of a lighting unit according to an embodiment of the invention.

FIG. 10a is a perspective view of a lighting unit according to an embodiment of the invention.

FIG. 10b is a bottom view of the lighting unit of FIG. 10a.

FIG. 10c is another perspective view of the lighting unit of FIG. 10a.

FIG. 10d is another bottom view of the lighting unit of FIG. 10a.

DETAILED DESCRIPTION

Figure 7A:
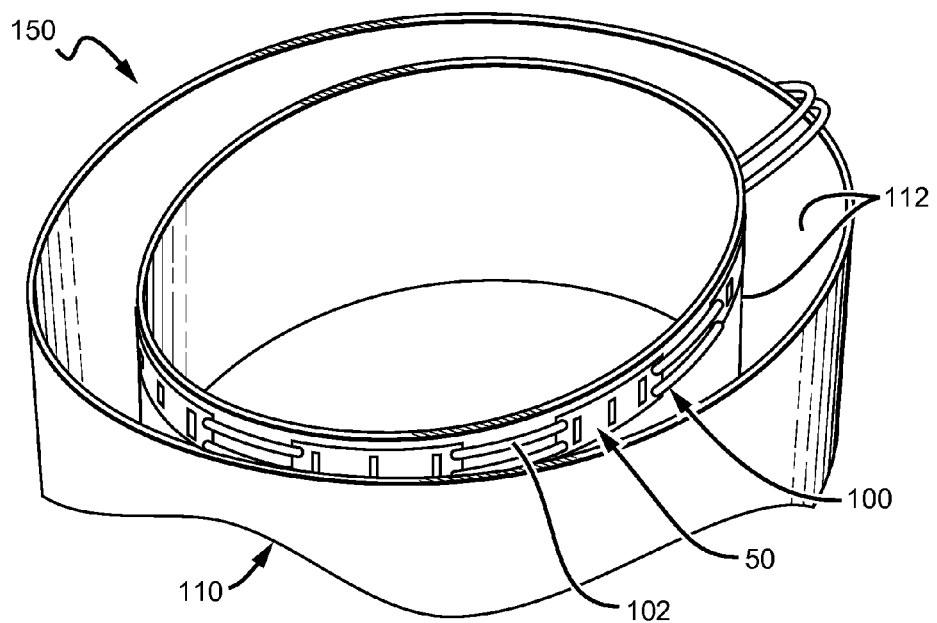
FIG. 7a is a perspective view of a channel letter lighting system according to an embodiment of the invention.

The invention described herein is directed to different embodiments of a low profile lighting unit that in some embodiments is adapted to be adjustable, such that the lighting unit can be arranged in different configurations to accommodate various lighting applications. The lighting unit can comprise many different materials and can be used in many different lighting applications, such as but not limited to channel letter lighting. The lighting unit according to the present invention can be arranged in many different ways with many different components, and is generally arranged to provide uniform illumination to a channel letter. In some embodiments, the lighting unit can comprise a flexible PCB, at least one light emitting element on the flexible PCB, conductors to provide an electrical current to each of the at least one light emitting elements, and a housing covering part of the flexible PCB. The housing is adapted to be flexible and configured to expose the light emitting elements, such that the light emitting elements emit light in a direction away from the housing in response to an electrical current supplied by the conductors. This arrangement allows for the lighting unit to be bent and/or twisted in different directions in order to accommodate different channel letter housings. An advantage of the lighting unit is that the shape of the lighting unit can be easily adjusted to take the form of the channel letter housing, to which it is mounted to, without having to cut lighting unit and/or conductors. This allows a single individual to easily install the lighting unit.

Some embodiments of the lighting units according to the invention can be used to provide illumination for channel letter lighting applications. However, the invention is not intended to be limited to such applications. The lighting units can be used in many different lighting applications, such as but not limited to, perimeter or border lighting. The lighting units can also be arranged to allow a single individual to easily install and manipulate the lighting unit to accommodate the shape of the housing unit which the light units are being installed.

The invention is described herein with reference to certain embodiments, but it is understood that the invention can be embodied in many different forms and should not be construed as limited to the embodiments set forth herein. In particular, the present invention is described below in regards to certain lighting units in different configurations, but it is understood that the invention can be used for many other devices having many different configurations. The components can have different shapes and sizes beyond those shown in the figures or discussed herein.

It is to be understood that when an element or component is referred to as being "on" another element or component, it can be directly on the other element or intervening elements may also be present. Furthermore, relative terms such as "between", "within", "below", and similar terms, may be used herein to describe a relationship of one element or component to another. It is understood that these terms are intended to encompass different orientations of the device in addition to the orientation depicted in the figures.

Although the terms first, second, etc. may be used herein to describe various elements or components, these elements or components should not be limited by these terms. These terms are only used to distinguish one element or component from another. Thus, a first element discussed herein could be termed a second element without departing from the teachings of the present application. It is understood that actual systems or fixtures embodying the invention can be arranged in many different ways with many more features and elements beyond what is shown in the figures.

Embodiments of the invention are described herein with reference to illustrations that are schematic illustrations. As such, the actual thickness of elements can be different, and variations from the shapes of the illustrations as a result, for example, of manufacturing techniques and/or tolerances are expected. Thus, the elements illustrated in the figures are schematic in nature and their shapes are not intended to illustrate the precise shape of a region of a device and are not intended to limit the scope of the invention.

With reference to FIGS. 5a-5c, an exemplary lighting unit 50 is shown. In some embodiments the lighting unit 50 is configured such that the lighting unit 50 can be used to provide illumination for channel letters and/or perimeter or border lighting applications. The lighting unit 50 comprises a PCB 66 having a top surface 65 and a bottom surface 67, at least one light emitting element 58 on the top surface 65, and a housing 52. The lighting unit 50 further comprises first and second conductors 54, 56 adapted to provide an electrical current to each of the at least one light emitting elements 58. The light emitting elements 58 are configured to emit light in a direction away from the housing 52, in response to the electrical current supplied by the first and second conductors 54, 56. The PCB 66 is further configured to be flexible, such that the PCB 66 is adapted to be bent in many different directions. In some embodiments, the PCB 66 is able to be twisted in a spiral formation, without negatively compromising the structural integrity of the PCB 66 or the electrical connection between the conductors 54, 56 and the light emitting elements 58. In other embodiments, the PCB 66 can be bent to form an obtuse angle, acute angle or a substantially right angle. In yet other embodiments, the PCB 66 is able to substantially conform to the shape of the structure to which it is mounted thereon, such as but not limited to a concave, convex, planar, multi-faceted, and/or a combination thereof. In yet further other embodiments, the PCB 66 can additionally be bent along multiple axes, such as being twisted into a spiral and bent such that the PCB 66 forms an obtuse angle, acute angle or a substantially right angle.

The housing 52 is configured to cover part of the PCB 66 and is arranged to receive each of the at least one light emitting elements 58. The housing 52 comprises an opening to receive each of the at least one light emitting elements 58. The opening 60 can be configured in many different ways, for example, as shown in FIG. 5a, the opening 60 has a plurality of angled sidewalls 61 that are arranged to assist in directing the emitted light from the light emitting elements 58. The embodiment shown in FIG. 5a discloses four angled sidewalls 61, but the sidewalls 61 are not intended to be limited to the configuration of the embodiment of FIG. 5a. In other embodiments, the opening 60 has a continuous sidewall 61 such that the opening 60 has a substantially conical shape. However, in other embodiments, the opening 60 can have any number of sidewalls 61 that can be arranged to direct the emitted light in a desired light distribution pattern. In other embodiments, the opening 60 comprises a reflector on the sidewalls 61. The reflector assists in directing the emitted light away from the PCB 66, and reduces the amount of emitted light that may is emitted in a direction not consistent with the desired light distribution pattern. The reflector can be in many different configurations, such as but not limited to, a reflective layer, reflective particles on the sidewalls 61, a reflective cup, or the like.

The housing 52 in FIG. 5a is configured to cover part of the top surface 62 of the PCB 66 and part of the first and second conductors 54, 56. However, the housing 52 does not enclose all of the PCB 66. As shown in FIG. 5b, the bottom surface 64 of the PCB 66 is exposed and is not covered by the housing 52. This configuration results in an overall profile of the lighting unit 50 that is reduced such that the lighting unit 50 does not protrude as far as conventional lighting modules, which allows the lighting unit 50 to have a low profile. An advantage of the invention is that the low profile lighting unit can be used in channel letter applications wherein the channel letter has limited and/or reduced spacing for the lighting unit. The exposed bottom surface 64 is mounted onto a surface within the channel letter housing and has the ability to alter the shape of the lighting unit 50 so as to conform to the shape of the mounting surface. In one embodiment, the back surface 64 of the PCB 66 has an adhesive strip to mount the lighting unit 50 onto the mounting surface. While in other embodiments, the lighting unit 50 is configured to receive a screw, nail, rivet, or the like to mount the lighting unit 50 to the mounting surface. However, in other embodiments, both the adhesive strip and the screw, nail, rivet, or the like can be used together to mount the lighting unit 50.

In one embodiment, the housing 52 is an overmolded housing and can be made of many different types of materials known in the art, such as but not limited to plastic, polyvinyl chloride (PVC) or any other material able to be overmolded. The housing 52 is arranged to be thin to allow the PCB 66 to be bent and/or twisted, while thick enough to provide sufficient protection to the electronic circuitry and components that may be on the PCB 66. The housing 52 provides protection to the components on the PCB 66, namely the light emitting elements 58 and the point at which the conductors 54, 56 are connected to the PCB 66. The components on the PCB 66 are not intended to be limited to only the light emitting elements 58, the PCB 66 can have other electrical elements or components that can be used to control, adjust, modify and/or regulate the emission of the light emitting elements 58, such as but not limited to resistors, microcontrollers, constant current circuitry and the like. In some embodiments, the components on the PCB 66 and/or the PCB 66 can be covered by an encapsulant or other sealant, in addition to being within the overmolded housing 52, which further assists in protecting the components on the PCB 66 and/or the PCB 66. While in other embodiments, the components on the PCB 66 and/or the PCB 66 are only covered by an encapsulant or other sealant without the overmolded housing 52. In FIGS. 5a and 5b, the housing 52 is an overmolded housing that extends past the ends of the PCB 66 to seal the first and second conductors 54, 56, while not covering the bottom surface 64 of the PCB 66. The housing 52 is not intended to be limited to overmolded housing, but instead can be any type of housing, encapsulant and/or sealant that allows the PCB 66 to be bent and provide protection to the electrical circuit and other elements on the PCB 66.

The first and second conductors 54, 56 are electrically connected to the PCB at opposite ends of the PCB 66 and are adapted to provide an electrical current to each of the at least one light emitting elements 58. Part of the conductors 54, 56 are covered by the housing 52, specifically the electrical connection point, and extend outwards from the housing 52. In other embodiments, the conductors 54, 56 are electrically connected to the PCB 66 and continue on the PCB 66 towards the next electrical connection point, such that the housing 52 covers the conductors 54, 56 that are on the PCB 66. The conductors 54, 56 can be electrically connected to a power supply and/or another lighting unit 50 to form an array of lighting units 50. In some embodiments, the conductors 54, 56 can be bonded conductors, as shown in FIGS. 5a and 5b, whereas in other embodiments, the conductors 54, 56 can be individual conductors, as shown in FIG. 5c.

FIGS. 6a-7c disclose a light assembly 100 comprising a plurality of lighting units 50 that can be used in a channel letter lighting application. For the same or similar features, the same reference numbers will be used throughout the application herein. FIGS. 6a and 6b show the light assembly 100 using only two lighting units 50 connected together in a daisy chain configuration. However, in other embodiments, more than two lighting units 50 can be used in the light assembly 100 and the invention is not intended to be limited to a light assembly 100 comprised of only two lighting units 50.

The light assembly 100 is a low profile lighting solution due to the lighting units 50. As discussed above, the housing 52 of the lighting units 50 is configured to minimize the amount that the lighting unit 50 protrudes into the channel letter housing to which it is mounted. The light assembly 100 further comprises a joint 102 between each of the lighting units 50, such that the joint 102 allows the light assembly 100 to bend along the joint 102. The light assembly 100 can be installed in a variety of ways, such as but not limited to, multiple rows or in curved patterns on a surface of the channel letter housing. An advantage of the invention is that the lighting units 50 allows for the light assembly 100 to bend and/or twist to accommodate for different shapes of the surface to which the light assembly 100 is mounted, much like conventional LED ribbon products, while yet overcoming the limitations of conventional LED ribbon products discussed above. Conventional. LED ribbon products can only be bent in one direction and often requires an installer to cut and splice the LED ribbon into several short, straight sections. The configuration of the invention allows the light assembly 100 to be more elegantly installed around the curved walls or routed out channels of channel letters without having to cut and splice, as is customary in conventional LED ribbon products.

The light assembly 100 is adapted to conform to the shape of the walls and/or surfaces of the channel letter housing. For example, as shown in FIG. 7*a*, a channel letter lighting system 150 comprises a channel letter housing 110 comprising a plurality of sidewalls 112, wherein at least one of the sidewalls 112 is curved. The light assembly 100 is mounted onto the sidewalls 112 and is adapted to conform to the shape of the sidewall 112 such that the lighting units 50 and/or the joint 102 are flexed to correspond with the shape of the sidewall 112. An advantage of the invention is that the light assembly 100 has a low profile and does not substantially protrude into the channel letter housing 110. Furthermore, the low profile configuration of the lighting unit 50 allows the lighting unit 50 to be able to be bent or flexed to correspond to its mounting surface. The light assembly 100 can be mounted onto the sidewall 112 using a variety of methods, such as but not limited to, using adhesive between the lighting unit 50 and the sidewall 112, using a nail, screw, rivet or the like to mount the lighting unit 50 onto the sidewall 112. The first and second conductors 54, 56 between adjacent lighting units 50 in the embodiment of FIG. 7*a*, are shown as being individual conductors. However, in other embodiments, the first and second conductors 54, 56 can be bonded. Also, in the embodiment shown in FIG. 7*a*, the housing 52 is not present so as to provide an internal view of the PCB 66 when in a flexed configuration. It is to be understood that the lighting units 50 of the light assembly 100 can comprise a housing 52, while in other embodiments, the lighting units 50 do not have a housing.

Figure 7B:
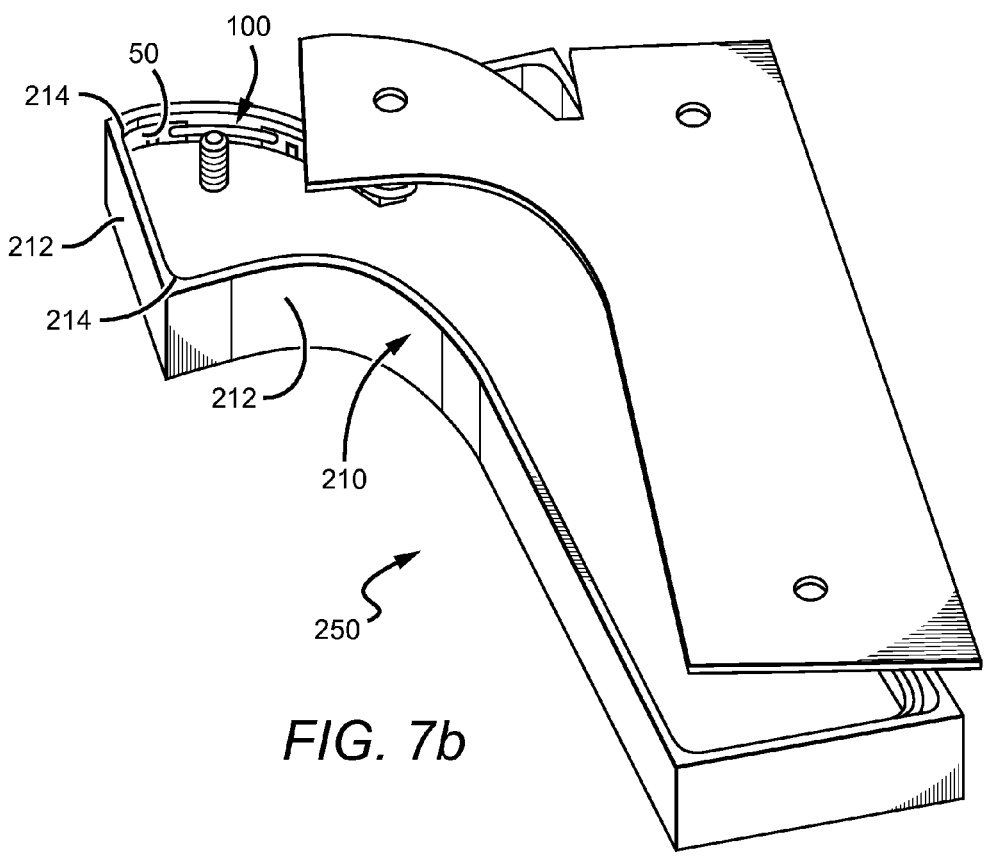
FIG. 7b is a perspective view of a channel letter lighting system according to an embodiment of the invention.

FIGS. 7*b* and 7*c* show another embodiment of a channel letter lighting system 250, wherein a channel letter housing 210 comprises a plurality of sidewalls 212, wherein at least one of the sidewalls 212 is curved or bent, such that the sidewall 212 has an angled surface. The channel letter housing 210 can also be configured such that adjacent sidewalls 212 come together to form a junction 214, wherein the junction 214 of the adjacent sidewalls 212 forms an acute, obtuse or right angle. As shown in FIGS. 7*b* and 7*c*, the light assembly 100 is mounted onto the sidewalls 212 and is adapted to substantially conform to the shape of the sidewalls 212. At least one of the junctions 214, in FIGS. 7*b* and 7*c*, is arranged to form an acute angle, wherein the lighting unit 50 is bent to substantially conform to the acute angle formed by the junction 214. The lighting unit 50 is arranged to be flexible such that the lighting unit 50 can be bent to match the angled shape of the junction 214, and not break due to being bent to substantially conform to the acute angle formed by the adjacent sidewalls 212 that form junction 214. The lighting assembly 100 provides sufficient lighting so as to give the appearance that a single light source is illuminating the channel letter housing 210. An advantage of the invention is that the lighting assembly is arranged to provide an even light distribution, even in the configuration where one or more of the lighting units 50 are bent to conform to the shape of the surface to which they are mounted. Another advantage of the invention is that the joint 102 allows the lighting assembly 100 to bend at the joint 102 around abruptly angled sidewalls or junctions that are excessively bent, such that mounting the lighting unit 50 would be difficult or could result in excessive bending of the lighting unit 50 thereby causing deformation, breaking and/or failure of the lighting unit 50.

The embodiments shown in FIGS. 7*a*-7*c* show the lighting assembly 100 mounted on the sidewalls 112, 212 of the channel letter housings 110, 210. However, the invention is not intended to be limited to such arrangements. In other embodiments, the lighting assembly 100 can be mounted on the channel letter housing floor instead of the sidewalls. In yet other embodiments, the lighting assembly 100 can be mounted on the sidewalls and the floor of the channel letter housing.

FIGS. 8*a*-8*c* show another embodiment of a low profile lighting unit 70, according to the invention. The lighting unit 70 comprises an elongated flexible PCB 72 having a top surface and a bottom surface 76, and at least one light emitting element 58 on the top surface 74. The lighting unit 70 further comprises first and second conductors 78, 80 adapted to provide an electrical current to each of the at least one light emitting elements 58, and at least one connector 82, wherein the first and second conductors 78, 80 are received by a respective at least one connector 82 in order to form an electrical connection with the PCB 72. The lighting unit 70 is adapted to be separable, such that part of the PCB 72 is configured to be separated from the remainder of the PCB 72 while maintaining the electrical connection of the first and second conductors 78, 80. The separated portion of the PCB 72 comprises at least one of the light emitting elements 58 and is adapted to be arranged in different configurations to accommodate various lighting applications.

The PCB 72 is similar to the PCB 66 discussed above, such that the PCB 72 is configured to be flexible and is adapted to be bent in many different directions. In some embodiments, the PCB 72 is able to be twisted in a spiral formation, without negatively compromising the structural integrity of the PCB 72. In other embodiments, the PCB 72 can be bent to form an obtuse angle, acute angle or a substantially right angle. In yet other embodiments, the PCB 72 is able to substantially conform to the shape of the structure to which it is mounted thereon. In yet further other embodiments, the PCB 72 can additionally be bent along multiple axes, such as being twisted into a spiral and bent such that the PCB 66 forms an obtuse angle, acute angle or a substantially right angle.

The first and second conductors 78, 80 are configured to run along the length of the PCB 72 and are electrically connected to the PCB 72. The conductors 78, 80 are received by the respective at least one connector 82 that is on the top surface 74 of the PCB 72. As shown in FIG. 8*a*-8*b*, the conductors 78, 80 are arranged to run along the first edge 84 and the second edge 86 of the PCB 72 in a repetitive serpentine-like pattern. The invention is not intended to be limited to arranging the conductors 78, 80 in the serpentine-like pattern shown in FIGS. 8a-8c, the conductors 78, 80 can be arranged in many different configurations. In other embodiments, the conductors 78, 80 can run along only one of the edges 84, 86. In yet other embodiments the conductors 78, 80 do alternate running along the first and second edges 84, 86, but do so in a random or non-repetitive pattern configuration. Each of the at least one connector 82 are positioned on the top surface 74 of the PCB 72 between adjacent light emitting elements 58 and form the electrical connection between the conductors 78, 80 and the light emitting elements 58 on the PCB 72. The connector 82 can be any type of connector known in the art. In some embodiments, the connectors 82 can be Insulation-displacement connectors (IDC), Insulation-piercing connectors (IPC), or a combination thereof.

The PCB 72 further comprises a perforation 88 such that part of the PCB 72 is adapted to be separated from the remaining PCB 72, forming a separated lighting unit 90. The separated lighting unit 90 comprises at least one light emitting element 58 and maintains the electrical connection between the remaining part of the PCB 72. An advantage of the invention is that the lighting unit 70 can be installed in multiple rows or in curved patterns on a flat surface without the need to cut, splice or solder due to the PCB 72 adapted to form one or more separated lighting units 90. FIGS. 8a-8c depict the perforation 88 as being a hole through the PCB 72. However, the invention can be configured in many different ways and is not intended to be limited to the embodiments shown in FIGS. 8a-8c. In some embodiments, the perforation 88 can be a plurality of aligned holes arranged to allow the PCB 72 to be easily separated. In other embodiments, the perforation 88 can be a score, notch, or groove that allows the PCB 72 to be separated. In yet other embodiments, the perforation 88 can be a hole in combination with a score, notch, or groove.

An advantage of the invention is that the lighting unit 70 can be partitioned to form a plurality of separated lighting units 90 that can allow the lighting unit 70 to be manipulated and arranged to accommodate the surface to which it is being mounted. The separated lighting units 90 are flexible and have a low profile, similar to the lighting units 50 discussed above, and can be bent in many different ways. The lighting unit 70 is easily configurable to account for many different lighting applications and allows an installer to selectively form separated lighting units 90, of any length, while installing the lighting unit 70. FIGS. 8b-8c, show that the separated lighting units 90 are formed by separating the PCB 72 at each perforation 88. However, in other embodiments, the separated lighting units 90 can be different lengths and can have a perforation 88 that is intact and has not been utilized to form a separated lighting unit 90.

In some embodiments, the lighting unit 70 comprises a housing 85, as shown in FIG. 9. The housing 85 covers part of the PCB 72 and part of the conductors 78, 80, and can also provide protection for the light emitting elements 58 from moisture, dust and other environmental elements that may cause the light emitting elements 58 to fail or have a reduced or altered light output. The housing 85 can also be configured to disperse light emitted from the light emitting elements 58. The housing 85 is also arranged to be clear, flexible over-molded housing to cover at least part of the lighting unit 70. In some embodiments, the conductors 78, 80 are near the top surface 74 and covered by the housing 85, and are arranged to allow the installer to easily peel the conductors 78, 80 out from the housing 85 during installation. In some embodiments of the invention, the housing 85 encloses the entire lighting unit 70.

The lighting unit 70 can be utilized in a similar fashion as the light assembly 100, discussed above. The lighting unit 70 is a low profile lighting solution that is configured to minimize the protrusion into the channel letter housing or other lighting application to which the lighting unit is mounted. The lighting unit 70 can be installed in a variety of ways, such as but not limited to, multiple rows or in curved patterns on a surface of the channel letter housing. An advantage of the invention is that the separated lighting units allows for the lighting unit 70 to bend and/or twist to accommodate for different shapes of the surface to which the lighting unit 70 is mounted, much like conventional LED ribbon products, while yet overcoming the limitations of conventional LED ribbon products discussed above. Conventional LED ribbon products can only be bent in one direction and often requires an installer to cut and splice the LED ribbon into several short, straight sections. The configuration of the invention allows the lighting unit 70 to be more elegantly installed around the curved walls or routed out channels of channel letters without having to cut and splice, as is customary in conventional LED ribbon products.

The lighting unit 70 is adapted to conform to the shape of the walls and/or surfaces of the channel letter housing. The lighting unit 70 is flexible and can be bent to conform to the surface of the mounting surface. In some instances, the curvature of the mounting surface does not allow the lighting unit 70 to be mounted, and instead a separated lighting unit 90 is better suited to be mounted on such a curved surface. The lighting units 70 and the separated lighting units 90 can be mounted onto the mounting surface in similar manners as the light assembly 100. The lighting unit 70 is arranged to provide sufficient lighting so as to give the appearance that a single light source is illuminating the channel letter housing or other lighting application to which the lighting unit 70 is mounted. An advantage of the invention is that the lighting unit 70 is arranged to provide an even light distribution, even in configurations where one or more separated lighting units 90 are present and/or bent to conform to the shape of the mounting surface. Another advantage of the invention is that the conductors 78, 80 allow the separated lighting units 90 to be placed around abruptly angled mounting surfaces that could present difficulty in mounting the lighting unit 70.

FIGS. 10a-10d show yet another embodiment of the invention. FIGS. 10a-10d show another embodiment of a low profile lighting unit 300, according to the invention. The lighting unit 300 is similar to lighting unit 70, described above. The lighting unit 300 comprises an elongated flexible PCB 302 having a top surface 304 and a bottom surface 306, and at least one light emitting element 58 on the top surface 304. The lighting unit 300 further comprises a plurality of first and second conductors 312, 314 adapted to provide an electrical signal to each of the at least one light emitting elements 58. The lighting unit 300 is also adapted to be separable, such that part of the PCB 302 is configured to be separated from the remainder of the PCB while maintaining the electrical connection of a respective one of the first and second conductors 312, 314. The separated section of the PCB comprises at least one of the light emitting elements 58 and is adapted to be arranged in different configurations to accommodate various lighting applications.

The PCB 302 has a plurality of sections 305 interconnected that forms the elongated PCB 302. Each of the plurality of sections 305 have at least one light emitting element 58 on the top surface 304. The lighting unit 300 has first and second conductors 312, 314 electrically connected between each of the plurality of sections 305, wherein a respective pair of first and second conductors 312, 314 electrically connects adjacent sections 305 of the PCB 302. The first and second conductors 312, 314 of the lighting unit 300 are not a continuous length of conductors that run the entire length of the lighting unit 300, as is shown in the embodiment of FIG. 8a, but instead are loops of conductors that are connected to adjacent end portions of adjacent sections 305.

The PCB 302 further comprises at least one perforation 308 between each of the plurality of sections 305 of the PCB, such that at least one of the plurality of sections 305 can be separated about the at least one perforation 308 while maintaining the electrical connection of the first and second conductors 312, 314. At least one advantage of the invention is that the lighting unit 300 can be installed in multiple rows or in curved patterns on a surface without the need to cut, splice or solder due to the PCB 302 adapted to form one or more separated sections 316. FIGS. 10a-10d depict the perforation 308 as being a hole through the PCB 302. However, the invention can be configured in many different ways and is not intended to be limited to the embodiments shown in FIGS. 10a-10d. In some embodiments, the perforation 308 can be a plurality of aligned holes arranged to allow the PCB 302 to be easily separated. In other embodiments, the perforation 308 can be a score, notch, or groove that allows the PCB 302 to be separated. In yet other embodiments, the perforation 308 can be a hole in combination with a score, notch, or groove. In some embodiments, the perforation 308 can be identified by text and/or marking to indicate where and/or how the section 305 is to be separated from the adjacent section 305. For example, the top surface 304 of the PCB 302 can have symbols or text, such as but not limited to "Break Here", proximate the at least one perforation 308 so that the separation point of the PCB 302 is clearly identified. The text or symbol can assist in proper separation of the sections 305 such that the PCB 302 is not damaged. The text is not intended to be limited to the example above, and can be any text in any language or any symbol. Furthermore, in some embodiments the text or symbol can be accompanied by markings that show where the separation should occur. For example, a line could be adjacent the at least one perforation 308 such that the sections 305 of the PCB 302 are separated about the perforation 308 along the line. The marking can be any shape or figure and is not intended to be limited to a line. In one embodiment the section 305 can be separated from the PCB 302 by bending the PCB 302 about the at least one perforation 308, while in other embodiments the section 305 can be separated by cutting the PCB 302 at the at least one perforation 308. The section 305 can be separated from the PCB 302 using many different methods and is not intended to be limited to the examples presented herein.

Yet another advantage of the invention is that the PCB 302 can be easily separated to form one or more separate sections 305 such that the lighting unit 300 can be customized to accommodate a wide variety of lighting solutions. The separated section 316 can be displaced from the remaining PCB 302 by a factor of the length of the first and second conductors 312, 314. FIG. 10c shows an embodiment wherein a plurality of sections 305 have been separated and shows that the separated sections 316 can be displaced from the respective adjacent sections 305 by extending the first and second conductors 312, 314. Each of the separated sections 316 can be displaced from the remaining PCB 302 and/or its respective adjacent section 305 in a variety of different configurations. The example shown in FIGS. 10c and 10d show the displacement in a linear configuration. However, in other embodiments, the separated section 316 can be displaced at an angle with respect to the PCB 302 and/or the adjacent section 305. In yet other embodiments, the separated section 316 can be displaced around and/or to overcome obstacles that would prevent the lighting unit 300 from being used in a given lighting application. The separated portion can be displaced from the PCB 302 and/or the adjacent section 305 in many different configurations and is not intended to be limited to the examples provided herein.

A respective pair of the first and second conductors 312, 314 are proximate a respective one of the at least one perforation 308. The first and second conductors 312, 314 are configured to be stored proximate the bottom surface 306 of the PCB 302. With reference to FIG. 10b, the first and second conductors are bended into a loop-like configuration and are additionally bended to be positioned adjacent the bottom surface 306 of the PCB 302. This configuration allows the lighting unit 300 to be mounted to a surface without any interference from the first and second conductors 312, 314. When a section 305 is separated about the at least one perforation 308, the first and second conductors 312, 314 can be released such that the separated section 316 can be displaced from the PCB 302 by a factor of the length of the first and second conductors. In some embodiments, the full length of the first and second conductors can be uncoiled or unfolded so that the separated section 316 can be extended at the maximum distance from the PCB 302 allowed by the lengths of the first and second conductors. While in other embodiments, the first and second conductors 312, 314 can be partially uncoiled or unfolded such that the separated section 316 can be partially displaced from the PCB 302 and/or adjacent section 305. At least one advantage of the invention is that when the section 305 is separated from the PCB 302 and/or adjacent section 305, the uncoiled or unfolded first and second conductors provide a joint 318 between the separated section 316 and the PCB 302 and/or an adjacent section 305, such that the joint 318 allows the lighting unit 300 to bend along the joint 318.

An advantage of the invention is that the lighting unit 300 can be separated to form a plurality of separated sections 316, wherein each separated section 316 emits light in a uniform light distribution that can allow the lighting unit 300 to be manipulated and arranged to accommodate the surface to which it is being mounted. The separated sections 316 are flexible and have a low profile, similar to the lighting units 50 and 70 discussed above, and can be bent in many different ways. The lighting unit 300 is easily configurable to account for many different lighting applications and allows an installer to selectively form separated sections 316, of any length, while installing the lighting unit 300. FIGS. 10c and 10d, show that the separated sections 316 are formed by separating the PCB 302 at each perforation 308. However, in other embodiments, the separated sections 316 can be different lengths comprising one or more sections 305, such that a perforation 308 is intact and has not been utilized to form a separated section 316.

In the embodiment of FIGS. 10a-10d, the lighting unit 300 has at least one mounting device 310 on the bottom surface 306 of the PCB 302, such that the lighting unit 300 is adapted to be mounted to a structure or surface. Each of the plurality of sections 305 of the PCB comprise at least one mounting device 310 to mount the lighting unit 300 to a structure or surface. The mounting device 310 in the embodiment of FIGS. 10a-10d can comprise a double-sided adhesive tape on the bottom surface 306 proximate the first and second conductors 312, 314. With reference to FIG. 10b, the first and second conductors, when in the bent position proximate the bottom surface 306, are also proximate the mounting device 310 and do not interfere with the mounting device 310. This configuration allows the mounting device 310 to properly adhere to the mount surface and further allows the lighting unit 300 to maintain its low profile. The first and second conductors 312, 314 between adjacent sections 305 in the embodiment of FIG. 10a-10d, are shown as being individual conductors. However, in other embodiments, the first and second conductors 312, 314 can be bonded.

The mounting device 310 can be arranged in many different ways and located in different locations and is not intended to be limited to the example provided herein. For example, the lighting unit 300 can be mounted onto a mounting surface using a variety of mounting devices 310, such as but not limited to, using adhesive between the lighting unit 300 and the mount surface, using a nail, screw, rivet or the like to mount the lighting unit 300 onto the mount surface.

The PCB 302 is also similar to the PCB 72 discussed above, such that the PCB 302 is configured to be flexible and is adapted to be bent in many different directions. In some embodiments, the PCB 302 is able to be twisted in a spiral formation without compromising the structural integrity and/or electrical conductivity of the PCB 302. In other embodiments, the PCB 302 can be bent to form an obtuse angle, an acute angle, or a substantially right angle. In yet other embodiments, the PCB 302 is able to substantially conform to the shape of the structure or surface to which it is mounted thereon. In yet other embodiments, the PCB 302 can be bent along multiple axes, such as being twisted into a spiral and bent such that the PCB 302 forms an obtuse, acute, or substantially right angle.

The lighting unit 300 is similarly configured as the lighting units 50 and 70 discussed above and can also be similarly used in the channel letter lighting system 150, 250 discussed above. The lighting unit 300 can be bent to match the angled shape of a junction 214 of a channel letter housing 210, and not break due to being bent to substantially conform to the acute angle formed by the adjacent sidewalls 212 of the channel letter housing 210 that forms junction 214. The lighting unit 300 is adapted to conform to the shape of the sidewall 212 to which the lighting unit 300 is mounted. In some embodiments, one or more sections 305 can be separated such that displacing adjacent sections 305 allows the lighting unit 300 to better conform to the mount surface. In yet other embodiments, the lighting unit 300 is bent about the joint 318 to better conform to the mount surface. An advantage of the invention is that the lighting unit 300 has a low profile and does not substantially protrude into the channel letter housing. Furthermore, the low profile configuration of the lighting unit 300 allows the lighting unit 300 to be able to be bent or flexed to correspond to its mounting surface. In some embodiments, components on the PCB 302, such as but not limited to resistors, diodes, and/or control circuitry, electrical connection points, other than the at least one light emitting elements can be covered by an encapsulant or other sealant, such that the PCB 302 is not substantially covered by the encapsulant or other sealant. The encapsulation can be applied via a selective mask, while in other embodiments, the encapsulant or other sealant can be applied manually by hand. Limiting what the encapsulant or other sealant covers protects the components of the lighting unit 300, while yet allowing the lighting unit 300 to maintain its flexible properties.

The lighting unit 300 provides sufficient lighting so as to give the appearance that a single light source is illuminating the channel letter housing 210. An advantage of the invention is that the lighting unit 300 is arranged to provide an even light distribution, even in the configuration where one or more sections 305 are separated and/or bent to conform to the shape of the surface to which they are mounted. Another advantage of the invention is that the joint 318 allows the lighting unit 300 to bend at the joint 318 around abruptly angled sidewalls or junctions that are abruptly bent, such that mounting the lighting unit 300 would be difficult or could result in excessive bending of the lighting unit 300 thereby causing deformation, breaking and/or failure. Another advantage of the invention is that the lighting unit 300 can be packaged as a long strip of lighting units in a coiled configuration. The coiled strip of lighting units can comprise a vast quantity of lighting units such that the coiled strip is on a spool, reel, or similar structure. This configuration provides an extended length of lighting units 300 that can be cut to a desired length of an array of lighting units 300. The desired length of the lighting units 300 are easy to install in a channel letter housing due in part to the lighting units 300 being prefabricated, thereby eliminating the need for an installer to measure and cut a desired length of the PCB 302 and then mount the light emitting elements 58 onto the PCB. As such, the lighting units 300 increases the efficiency of installing lighting units in channel letter housings or the like.

The lighting unit 300 is similarly configured as the lighting units 50 and 70 discussed above and can also be similarly used in the channel letter lighting system 150, 250 discussed above. The lighting unit 300 can be bent to match the angled shape of a junction 214 of a channel letter housing 210, and not break due to being bent to substantially conform to the acute angle formed by the adjacent sidewalls 212 of the channel letter housing 210 that forms junction 214. The lighting unit 300 is adapted to conform to the shape of the sidewall 212 to which the lighting unit 300 is mounted. In some embodiments, one or more sections 305 can be separated such that displacing adjacent sections 305 allows the lighting unit 300 to better conform to the mount surface. In yet other embodiments, the lighting unit 300 is bent about the joint 318 to better conform to the mount surface. An advantage of the invention is that the lighting unit 300 has a low profile and does not substantially protrude into the channel letter housing. Furthermore, the low profile configuration of the lighting unit 300 allows the lighting unit 300 to be able to be bent or flexed to correspond to its mounting surface. In some embodiments, components on the PCB 302, such as but not limited to resistors, diodes, and/or control circuitry, electrical connection points, other than the at least one light emitting elements can be covered by an encapsulant 307 or other sealant, such that the PCB 302 is not substantially covered by the encapsulant 307 or other sealant. The encapsulation 307 can be applied via a selective mask, while in other embodiments, the encapsulant 307 or other sealant can be applied manually by hand. Limiting what the encapsulant 307 or other sealant covers protects the components of the lighting unit 300, while yet allowing the lighting unit 300 to maintain its flexible properties.

We claim:
1. A lighting unit, comprising:
an elongated flexible printed circuit board (PCB) having a top surface and a bottom surface, said PCB comprising a plurality of sections;
at least one light emitting element on said top surface of each of said plurality of sections of said PCB; and
a plurality of first and second conductors, wherein each of said plurality of first and said conductor is electrically connected to adjacent sections of said PCB, wherein each of said plurality of first and second conductors is segmented between said adjacent sections to provide an electrical signal to said at least one light emitting element on each of said plurality of sections;

wherein each of said plurality of sections is adapted to be separated from said PCB while maintaining the electrical connection of said first and second conductors between a separated section and said PCB, wherein each of said plurality of first and second conductors are stored in a folded configuration opposite said at least one light emitting element, wherein at least part of said first and second conductors are unfolded to allow said separated section to extend a distance from an adjacent section.

2. The lighting unit of claim 1, wherein said PCB comprises a perforation between each of said plurality of sections such that said PCB can be severed about said perforation to form said separated section.

3. The lighting unit of claim 2, wherein said separated section can comprise at least one of said plurality of sections.

4. The lighting unit of claim 2, wherein said separated section can comprise more than one of said plurality of sections.

5. The lighting unit of claim 1, wherein said separated section comprises at least one light emitting element.

6. The lighting unit of claim 1, wherein each of said first and second conductors are proximate said bottom surface of said PCB such that each of said first and second conductors provide an extended length of said first and second conductors.

7. The lighting unit of claim 1, wherein each of said first and second conductors are in said folded configuration proximate said bottom surface of said PCB such that said separated section can be displaced from said PCB by a factor of the length of said first and second conductors.

8. The lighting unit of claim 1, wherein a respective one of said plurality of first and second conductors electrically connects adjacent sections of said PCB.

9. The lighting unit of claim 1, further comprising at least one mounting device on said bottom surface of said PCB, such that said lighting unit is adapted to be mounted to a structure or surface.

10. The lighting unit of claim 9, wherein said at least one mounting device comprising a double-sided adhesive tape.

11. The lighting unit of claim 1, wherein said separated section can be displaced from said PCB to alter a light emission pattern of said lighting unit.

12. The lighting unit of claim 1, further comprising a joint between said PCB and said separated section, such that said lighting unit can be arranged in different configurations to accommodate various lighting solutions.

13. The lighting unit of claim 12, said joint comprising said first and second conductors between said PCB and said separated section.

14. A channel letter lighting system, comprising:
a channel letter housing comprising a front, a back and at least one sidewall; and
a lighting unit within said channel letter housing comprising a plurality of sections interconnected with first and second conductors between each of said plurality of sections, wherein each of said plurality of sections comprising at least one light emitting element on a flexible printed circuit board (PCB), wherein said first and second conductors are connected to adjacent sections of said PCB, wherein each of said first and second conductors is segmented between said adjacent sections and are stored in a folded configuration opposite said at least one light emitting element;

wherein each of said plurality of sections is adapted to be separated from at least one adjacent section of said plurality of said sections while maintaining the electrical connection of said first and second conductors between a separated section and said at least one adjacent section, wherein at least part of said first and second conductors are unfolded to allow said separated section to extend a distance from said at least one adjacent section.

15. The channel letter lighting system of claim 14, wherein said lighting unit comprises at least one perforation between each of said plurality of sections such that said lighting unit can be separated about said at least one perforation.

16. The channel letter lighting system of claim 14, wherein said lighting unit is adapted to be mounted on said at least one sidewall of said channel letter housing.

17. The channel letter lighting system of claim 14, wherein said flexible PCB allows said lighting unit to conform to a mount surface of said channel letter housing.

18. The channel letter lighting system of claim 14, said lighting unit further comprising at least one mounting device on a bottom surface of said PCB opposite said at least one light emitting element, such that said lighting unit is adapted to be mounted to a structure or surface.

19. The channel letter lighting system of claim 18, wherein said at least one mounting device comprising a double-sided adhesive tape.

20. The channel letter lighting system of claim 14, wherein said lighting unit comprising an encapsulation layer covering part of each of said plurality of sections.

\* \* \* \* \*